(12) United States Patent
Imao et al.

(10) Patent No.: US 6,426,791 B2
(45) Date of Patent: Jul. 30, 2002

(54) METHOD AND APPARATUS FOR EVALUATING SEMICONDUCTOR FILM, AND METHOD FOR PRODUCING THE SEMICONDUCTOR FILM

(75) Inventors: Kazuhiro Imao, Gifu; Takashi Kuwahara, Ogaki; Yoshihiro Morimoto, Inazawa; Kiyoshi Yoneda, Gifu, all of (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/790,915

(22) Filed: Feb. 22, 2001

Related U.S. Application Data

(62) Division of application No. 09/032,243, filed on Feb. 27, 1998, now Pat. No. 6,218,198.

(30) Foreign Application Priority Data

Feb. 28, 1997 (JP) .............................. 9-46770
Feb. 19, 1998 (JP) ............................. 10-37342

(51) Int. Cl.⁷ .............................................. G01N 21/55
(52) U.S. Cl. ......................................... 356/30; 356/445
(58) Field of Search ........................... 356/30, 445, 446, 356/447, 448

(56) References Cited

U.S. PATENT DOCUMENTS

| 4,332,833 A | * | 6/1982 | Aspnes et al. ................. 427/8 |
| 5,314,831 A | * | 5/1994 | Hirae et al. .................... 356/30 |
| 5,825,498 A | * | 10/1998 | Thakur et al. ............... 356/448 |

FOREIGN PATENT DOCUMENTS

| JP | 6224276 | 8/1994 |
| JP | 9061344 | 3/1997 |
| JP | 9090330 | 4/1997 |

* cited by examiner

*Primary Examiner*—Richard A. Rosenberger
(74) *Attorney, Agent, or Firm*—Hogan & Hartson, L.L.P.

(57) ABSTRACT

Reflectance of a p-Si film crystallized by laser annealing is measured, a wave length dependency of the reflectance is found, and a first order rate of change is calculated to determine a minimum value near a wave length of 500 nm. The value is to be an inherent optical value under the laser power and relates to a grain size measured by Secco etching or the like. A number of correspondence between the optical value and the grain size are recorded and linearly plotted. By calculating the optical value from the reflectance in the p-Si film at in-line, the grain size is correspondingly determined. Thus, the semiconductor film can be in-line monitored, thereby improving a yield and saving a cost in producing a semiconductor device.

3 Claims, 13 Drawing Sheets

METHOD AND APPARATUS FOR EVALUATING SEMICONDUCTOR FILM, AND METHOD FOR PRODUCING THE SEMICONDUCTOR FILM

This is a divisional of application Ser. No. 09/032,243 filed Feb. 27, 1998, now U.S. Pat. No. 6,218,198 which application is hereby incorporated by reference in its entirety.

BACKGROUND OF THE INVENTION

1. Field of the Invention

The present invention relates to a method for evaluating and producing a semiconductor film formed on a substrate and an apparatus for producing the semiconductor film, and particularly to a method for evaluating and producing a semiconductor film and an apparatus for producing the semiconductor film being capable of incorporating an in-line evaluator of the semiconductor film thereinto.

2. Description of the Related Art

Active matrix LCDs (Liquid Crystal Displays) have been developed for mass production. The active matrix LCDs are highly integrated circuits whose level of integration is enhanced by using a technique of producing a semiconductor film on a substrate. The active matrix LCDs enable display of animation with high resolution. Such high resolution animation is obtained through a TFT (Thin Film Transistor), which is a switching element of a matrix display portion, disposed on one of two substrates with a liquid crystal interposed between them.

If the TFT can exhibit similar properties to that of a MOSFET (Metal Oxide Semiconductor Field Effect Transistor) produced on silicon substrate and the TFT can be produced on an insulating substrate, not only the switching elements but also peripheral driver circuits for providing desired driving signal voltages can be produced on the same substrate of the matrix display portion by forming a CMOS (Complementary Metal Oxide Semiconductor) around the display portion, whereby TFT-LCD with integrated driver circuits can be mass produced.

The TFT-LCD with needs no externally attached driver IC to a liquid crystal panel, thereby reducing processing steps and narrowing a frame. By narrowing the frame, a recent product such as a portable information terminal monitor and a handy video camera monitor would be small in size.

One of the critical objects in realizing the LCD with driver circuit is to form a good semiconductor film on a transparent insulating substrate such as glass and the like at a temperature within a heat resistance limit of the substrate. Conventionally, an amorphous semiconductor film, especially amorphous silicon (a-Si), is formed at a relatively low temperature of about 300° C. to 400° C. to produce the TFT on the substrate. However, such an a-Si TFT has a high on resistance. Therefore, it can be applied to the switching element on the matrix display portion, but cannot be utilized as a driver circuit requiring faster operation.

In contrast, poly crystal semiconductor includes many single crystal grains having a diameter of hundreds of Å to thousands of Å in contact each other. Once the poly crystal semiconductor is used for a channel layer, the TFT applicable to the driver portion can be formed. Especially a poly crystal silicon, i.e. polysilicon (p-Si) has a mobility of about tens to hundreds $cm^2/V \cdot s$ which is two orders of magnitude greater than that of the a-Si. When the p-Si is used, the CMOS is formed to have sufficient speed to be utilized as the driver in the LCD.

When the p-Si TFT LCD with integrated driver circuit is formed, forming the p-Si having a good film property on a glass substrate is most important. The p-Si film is typically formed by a SPC (Solid Phase Crystallization) method that applies heat to the a-Si film formed on the substrate to induce crystallization or by a low pressure CVD (Chemical Vapor Deposition) method that directly deposits the p-Si on the substrate. These film making methods are carried out at a high temperature of 700° C. to 900° C. Such a p-Si TFT LCD producing process is called a high temperature process, because it involves steps carried out at high temperature. In the high temperature process, an expensive substrate such as a heat-resistant quartz glass or the like is required, which leads to a high cost.

To decrease the cost, the applicant has developed a method conducted at a lower temperature of about 600° C. or less using an inexpensive non-alkali glass substrate or the like. Such a process of producing the p-Si TFT LCD while maintaining a critical temperature or less for the heat resistance of the substrate during all processes is called a low temperature process.

The low temperature process can be realized by ELA (excimer laser annealing) in which an excimer laser is applied to the a-Si to produce the p-Si by promoting crystallization. The excimer laser is an ultraviolet light produced when an excited excimer returns to a ground state. In the ELA, a laser beam shape is deformed with a predetermined optical system to irradiate to be processed film. Thermal energy is thus selectively applied to a surface of the a-Si. Crystallization is then carried out at a critical temperature or less for the heat resistance of the substrate to form the p-Si.

In the ELA, major problems are attaining optimum laser power setting and eliminating dispersion of irradiated laser energy. According to a relationship between the irradiated laser energy and a crystal diameter (grain size) of the p-Si as shown in FIG. 1, the greater the applied energy is, the greater the grain size is up to a certain point. However, once the applied energy exceeds the certain point, the grain size rapidly becomes small to be a microcrystalline. Consequently, laser light source power must be set adequately between a lower limit Ed and an upper limit Eu to obtain sufficiently large grain size (GM). The ELA is required to be always controlled based on the relationship shown in FIG. 1.

Especially when a power setting of the device is largely different from actual effective energy irradiated on the processed film accompanying a degradation of a laser medium, the grain size of the p-Si becomes smaller than that of the intended size in accordance with FIG. 1. Furthermore, in the ELA apparatus, a laser light emitted by a laser source passes through a long distance optical system to make an irradiated form suitable for a predetermined laser annealing. If the optical system is slightly contaminated with moisture, particle or the like at that time, the actual effective energy is lowered.

In addition, dispersion in the actual effective radiation energy is also a problem. In the case that the radiation intensity within an irradiation area of the laser beam is dispersed, the grain hardly grows, especially in an area where the radiation energy is out of the optimum range shown in FIG. 1.

One of the conventional methods for evaluating the grain size of the p-Si is Secco etching. However, a substrate having the film thereon evaluated with such method cannot be used as a product. Therefore, such evaluation is only for analogizing other substrates.

SUMMARY OF THE INVENTION

An object of the present invention is to solve such problems caused by the irradiated energy dispersion. The present invention provides a method and an apparatus for directly evaluating the p-Si film with an in-line monitor, and a method for producing the semiconductor film.

The present invention is made to achieve the above-described purpose, and includes the following properties. According to a method for evaluating a semiconductor film of the present invention, a quality of the semiconductor film to be evaluated is judged based on reflectance to light within a predetermined wave length of the semiconductor film to be evaluated.

According to the present invention, a crystal grain size is found in view of the reflectance of the semiconductor film to be evaluated based on a relationship between wave length of the light and the reflectance to the light within the predetermined wave length.

In the evaluation method of the present invention, a relationship between optical values of a plurality of semiconductor films and crystal grain sizes of the semiconductor films is pre-surveyed, wherein the optical values are calculated based on a relationship between wave length and reflectance to the light within the wave length range. Reflectance to light within the predetermined wave length of the semiconductor film to be evaluated is measured to calculate optical value, a crystal grain size corresponding to the optical value is selected based on the pre-surveyed correspondence and the crystal grain size selected is determined as a crystal grain size of the semiconductor film to be evaluated.

The reflectance is reflectance of light normally incident on the semiconductor film and the wave length is unique range approximately 500 nm, in which a relationship between the wave length and the reflectance or a first order rate of change of the reflectance is specific.

The optical value is a predetermined minimum value in a relationship between wave length of the light and the rate of change of the reflectance of the light within predetermined wave length.

With the above-described measurement of the reflectance to the light within the predetermined wave length of the semiconductor film, a quality of the semiconductor film can be evaluated, e.g. a crystal grain size can be determined. In other words, the semiconductor film formed can be evaluated without physical or chemical change, whereby the semiconductor film evaluated can be utilized as a final product as it is. Furthermore, the evaluation can be carried out by such a simple measurement and a calculation, which makes it easier to conduct production steps including an inspection step (evaluation step) of the semiconductor film in a short time.

Another aspect of the present invention is to provide an apparatus for evaluating a semiconductor film on a substrate, comprising: an irradiator for irradiating light to the semiconductor film to be evaluated; a detector for detecting the light reflected on the semiconductor film to be evaluated; a calculator for calculating an optical value of the semiconductor film to be evaluated based on data obtained through the detector; a memory for holding optical values of a plurality of semiconductor films and crystal grain sizes of the semiconductor films corresponding to the optical values, wherein the optical values are based on a relationship between a predetermined wave length and reflectance to the light within the predetermined wave length of the semiconductor films; and an evaluator for selecting a crystal grain size corresponding to the optical value of the semiconductor film to be evaluated which is calculated by the calculator referring to the correspondence held in the memory and determining the selected crystal grain size as a crystal grain size of the semiconductor film to be evaluated.

The calculator calculates the optical value of the semiconductor film to be evaluated in view of a relationship between the wave length of the light and the reflectance to the light within the predetermined area of wave length of the semiconductor film to be evaluated based on data obtained from the detector. The memory holds the optical values of a plurality of the semiconductor films corresponding to crystal grain sizes of the semiconductor films; the optical values are pre-calculated based on a relationship between wave length of the light and reflectance to the light within the predetermined range of wave length of the semiconductor films.

In addition, the evaluator is one part of the apparatus for producing the semiconductor film on the substrate and is used to inspect properties of the semiconductor film formed.

Thus, the evaluator of the present invention evaluates the quality of the semiconductor film without changing the film. Therefore, the evaluation process can be included in the semiconductor film producing steps. By incorporating the evaluator into the production apparatus, in-line processing can be realized.

Another aspect of the present invention is to provide a method for producing a semiconductor film on a substrate comprising the steps of: surveying a corresponding relationship between optical values of a plurality of semiconductor films and crystal grain sizes of the semiconductor films, wherein the optical values are calculated based on a pre-surveyed relationship between the wave length and reflectance to the light within the predetermined wave length of the semiconductor films; setting a threshold optical value for obtaining a predetermined crystal grain size based on the corresponding relationship; measuring reflectance to light of the semiconductor film to be evaluated disposed on the substrate within the predetermined wave length; comparing an optical value calculated from the reflectance measured with the threshold optical preset; and judging quality of the semiconductor film to be evaluated disposed on the substrate.

According to the present invention, the step of evaluating the crystal grain size of the semiconductor film can be included in the production steps, thereby constantly controlling the semiconductor film production steps. In the event that it is found that the property of the semiconductor film is not acceptable immediately after forming the film, the semiconductor film can be readily removed from the production line. Thus, the defective unit can be found and dealt with at an early stage, thereby saving an extra cost and improving yield. The film is evaluated in parallel with the production steps and the evaluation result is fed back to the semiconductor film production steps. The film production steps are always finely adjusted to the optimum conditions. Consequently, the semiconductor device having excellent properties is produced.

DESCRIPTION OF THE PREFERRED EMBODIMENTS

FIGS. 2 to 5 are graphs showing a relationship (relative ratio) between reflectance of a p-Si film formed by applying the ELA to a-Si film and a wave length. A multi channel spectrophotometer manufactured by Otuka Denshi, Co., Ltd. was used as a light emitting and light catching device. Light was normally irradiated to and normally reflected on the film. The ELA laser power is 520 mJ in FIG. 2, 530 mJ in FIG. 3, 540 mJ in FIG. 4 and 550 mJ in FIG. 5. As seen in these graphs, the curves have unique form near a wave length of 500 nm. Such a characteristic depends on the laser power. Especially in FIGS. 2 and 3, apparent characteristic slopes ( i.e. unique range ) are seen near the wave length of 500 nm. It is considered that a change in shape of the reflectance curves dependent on the laser power is resultant from a change in the grain size of the p-Si film.

The applicant then calculate a first order rate of change of the reflectance curves. FIGS. 6 to 9 are graphs showing a relationship between the first order rate of change of the reflectance in FIGS. 2 to 5 and a wave length, respectively. The rate of change curves are steeply changed near 500 nm, which is also seen in FIGS. 2 to 5. Although the reflectance is greater with the wave length being longer, the rate of change curves lower their slopes locally near 500 nm and form a trough, where the reflectance curves in FIGS. 2 to 5 show unique form. Such a relationship between the wave length and the reflectance is distinctly shown as depth of the trough in FIGS. 6 to 9, in which the troughs of the rate of change curves are indicated by arrows. According to the present invention, the minimum value at the trough represents the optical value which is an inherent value when performing the ELA under respective conditions.

Figure 1:
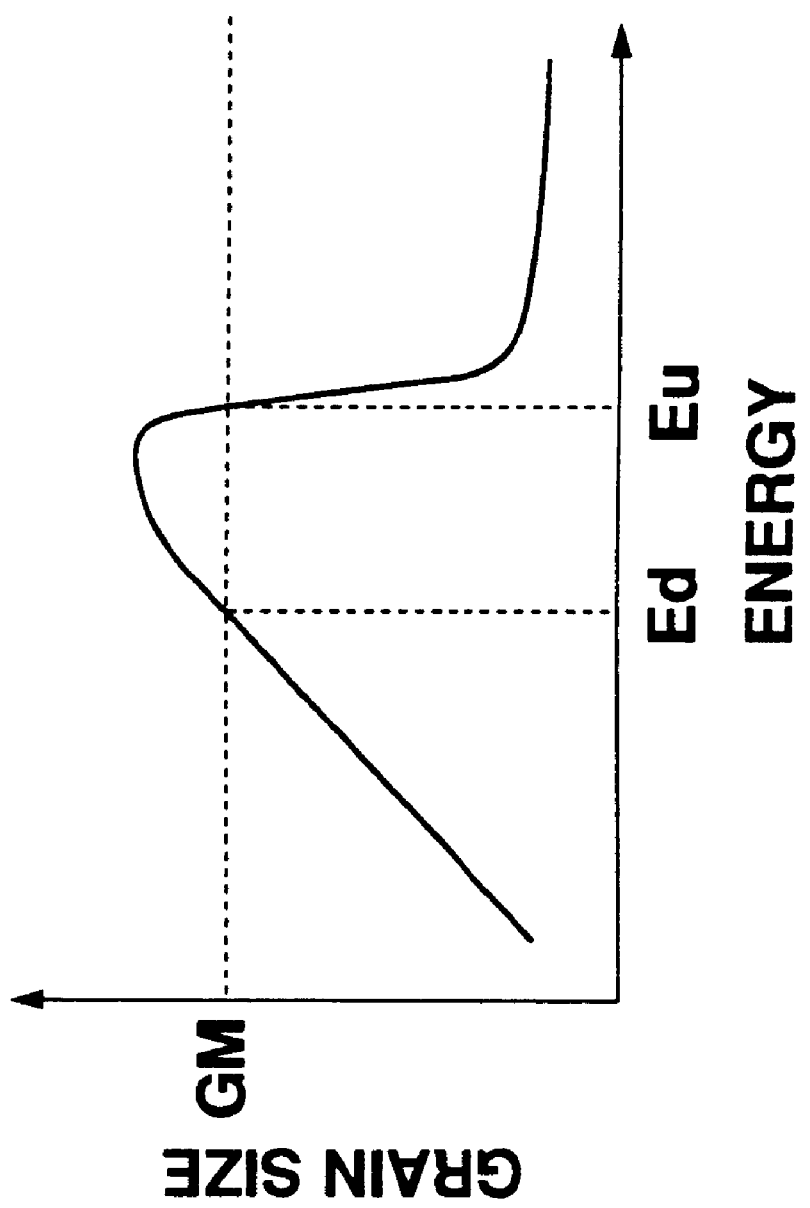
FIG. 1 is a graph showing a relationship between an irradiated laser energy and a grain size.
Figure 2:
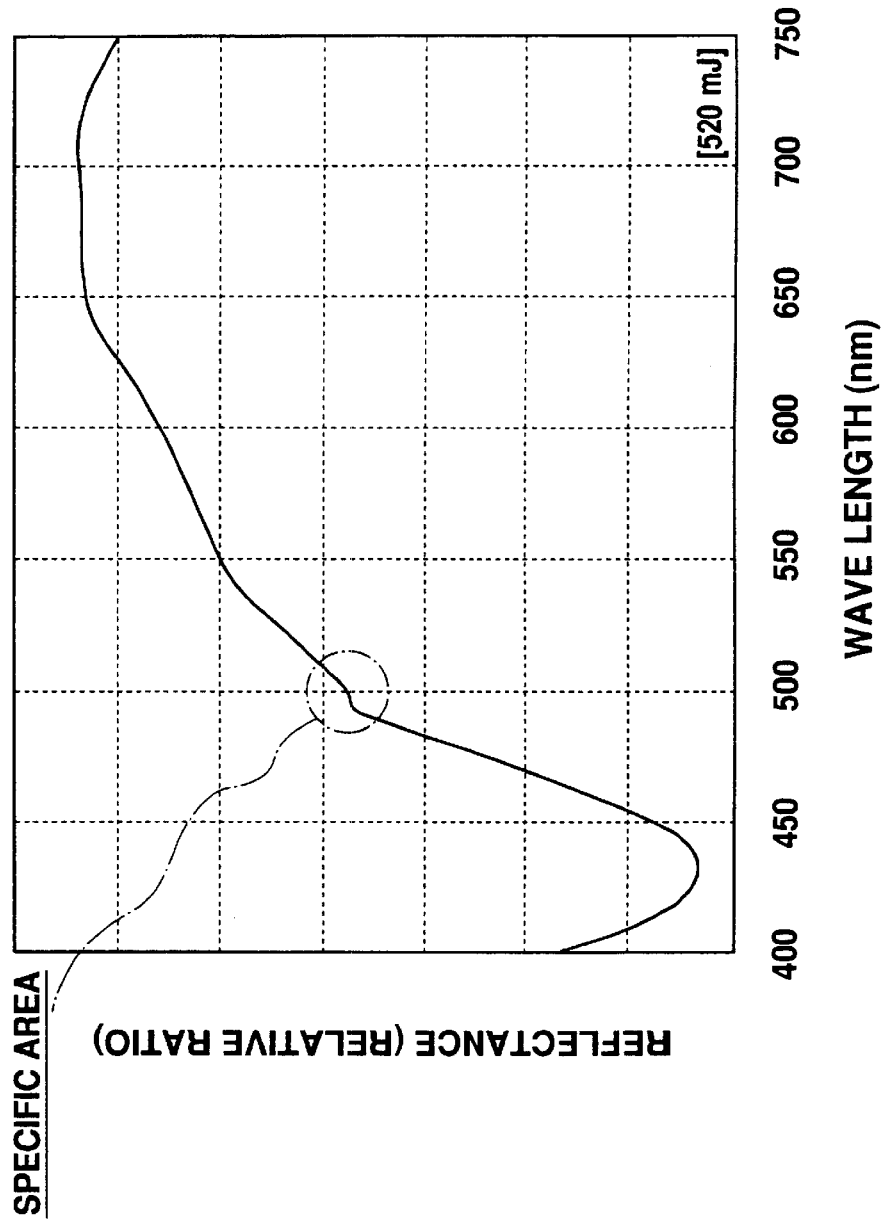
FIGS. 2, 3, 4 and 5 are graphs showing a relationship between a wave length and reflectance of a p-Si film according to the present invention.
Figure 3:
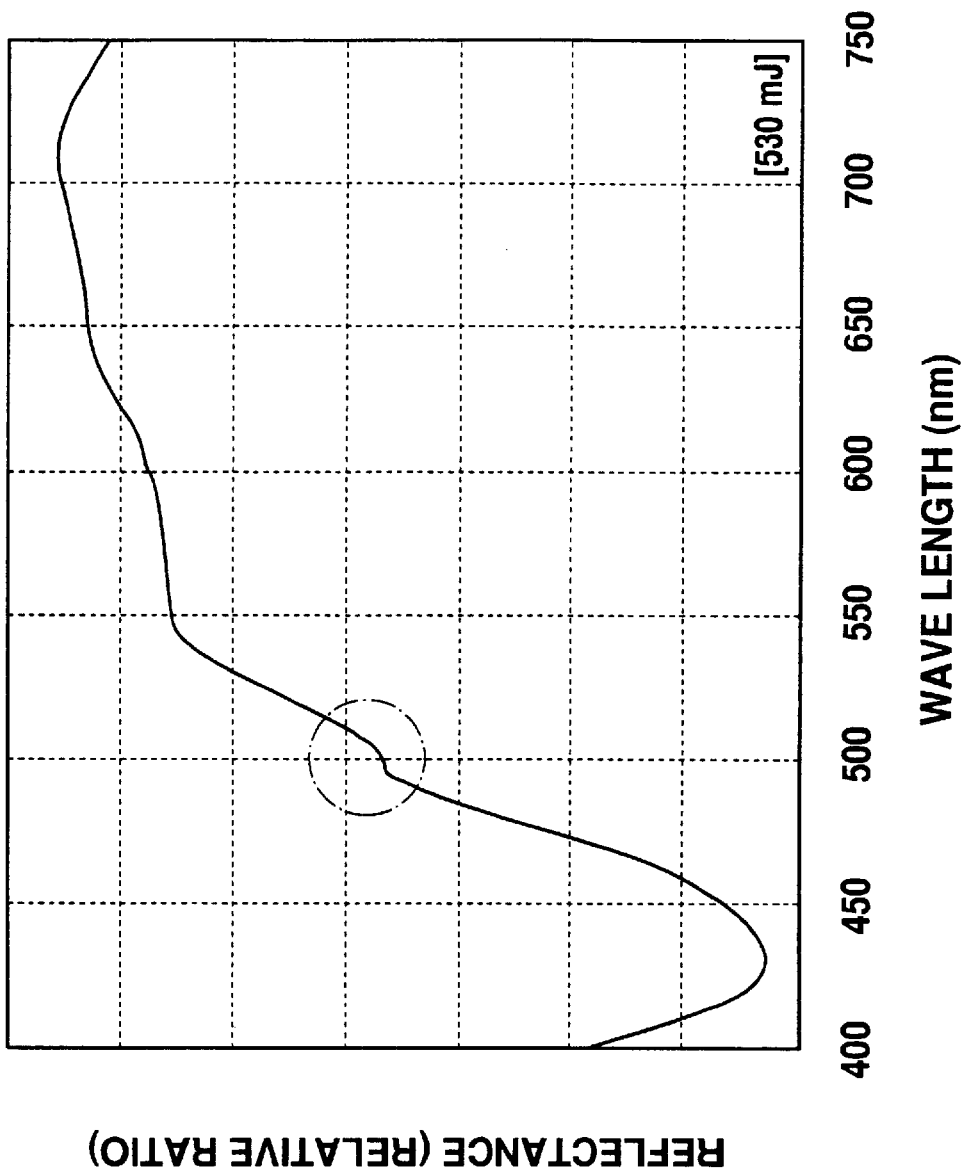
Figure 4:
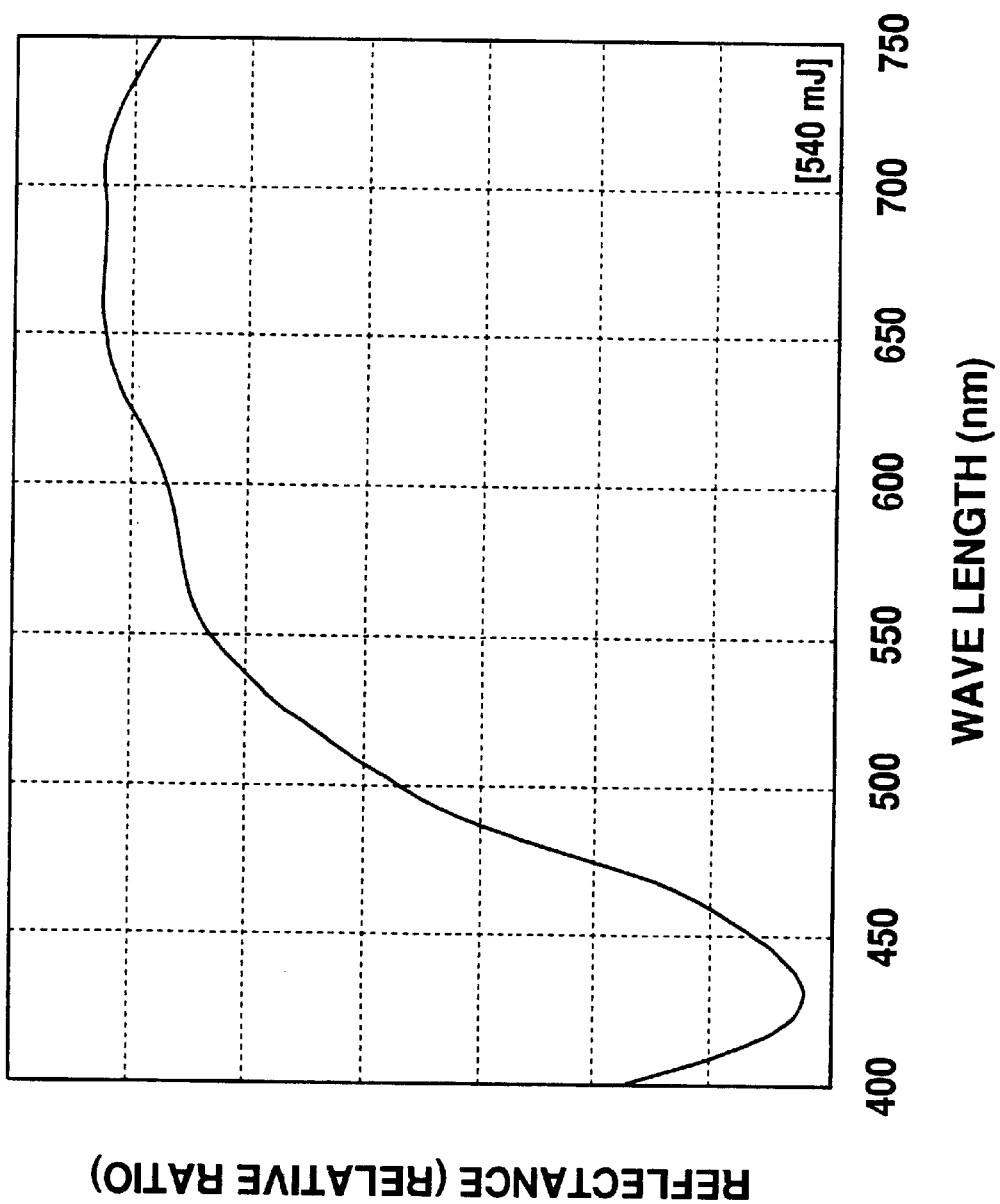
Figure 5:
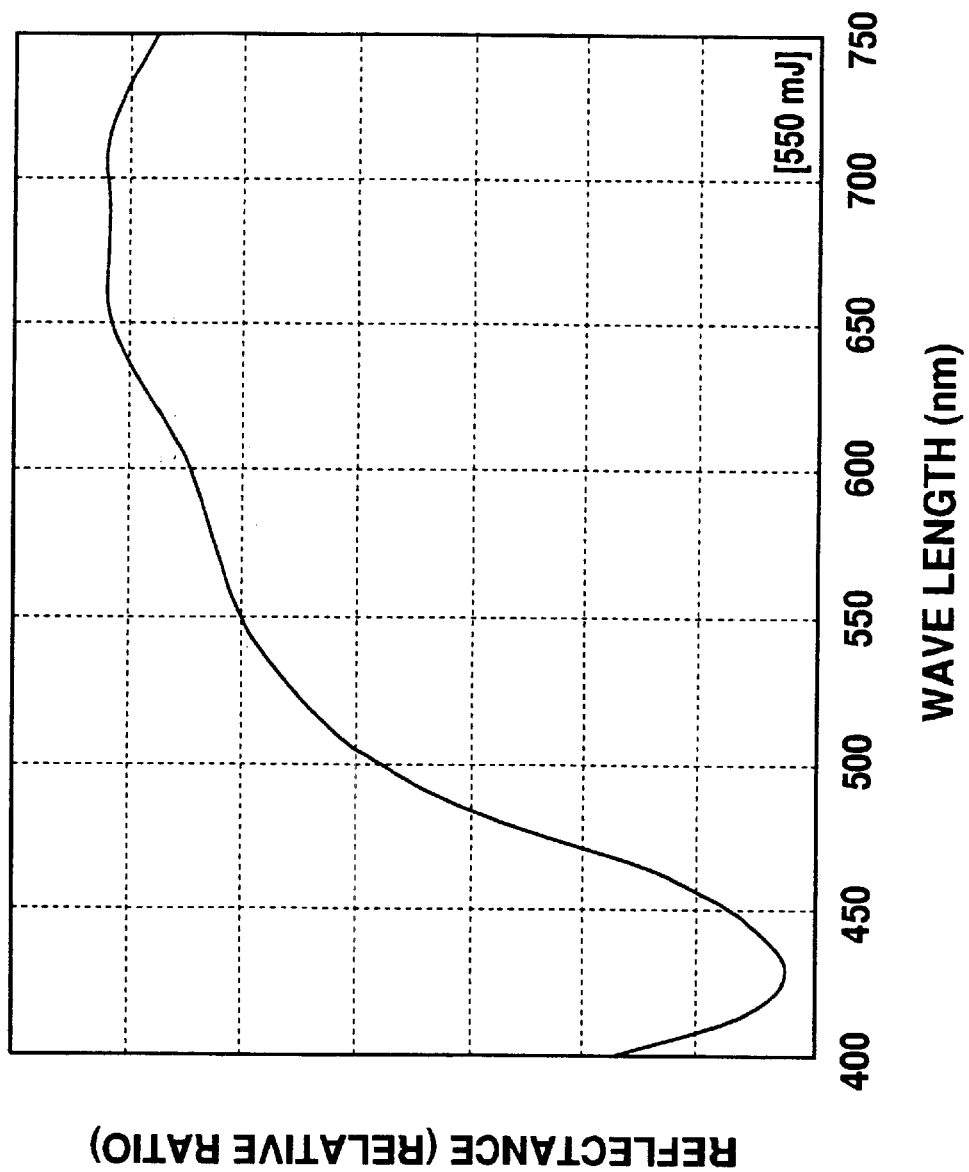
Figure 6:
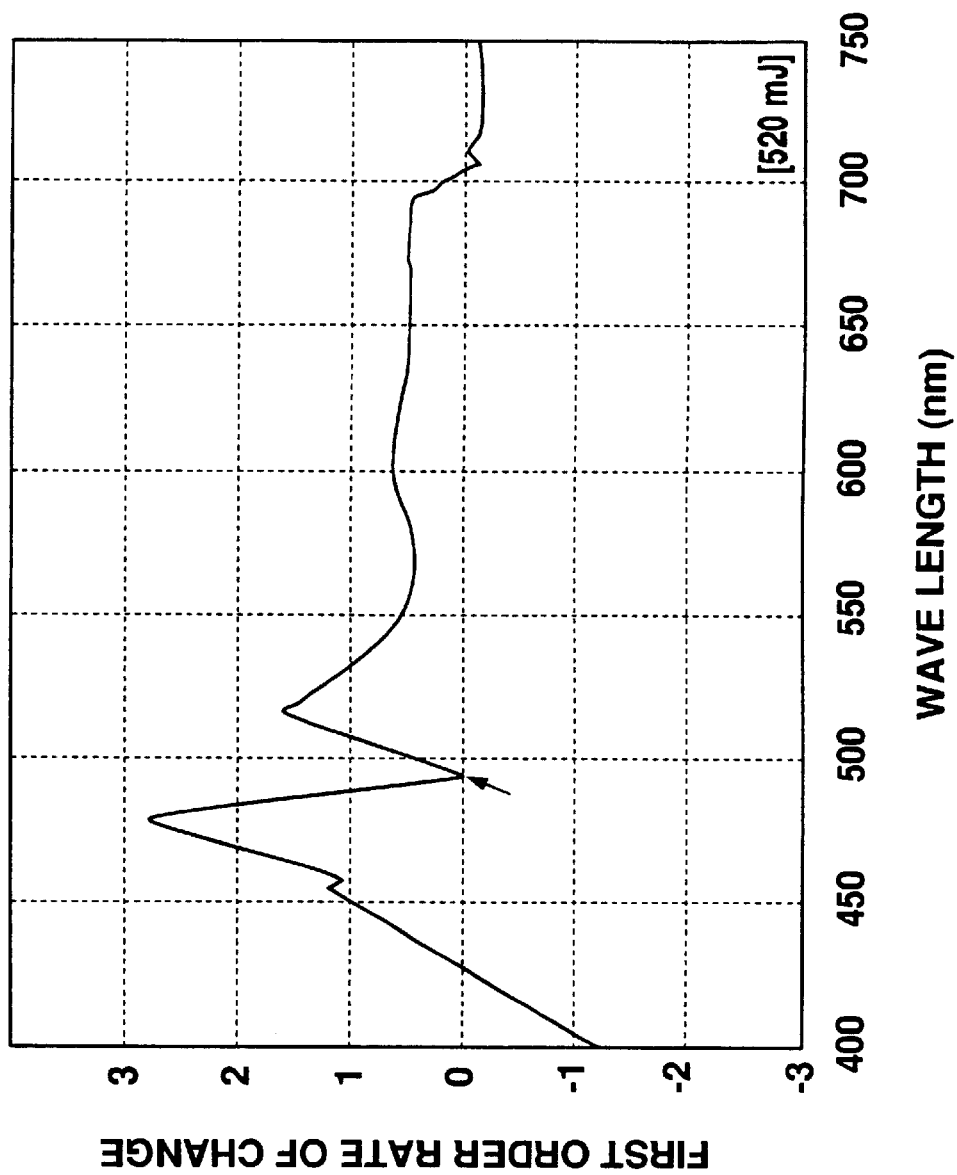
FIG. 6 is a graph showing a relationship between a first order rate of change in reflectance of FIG. 2 and a wave length.
Figure 7:
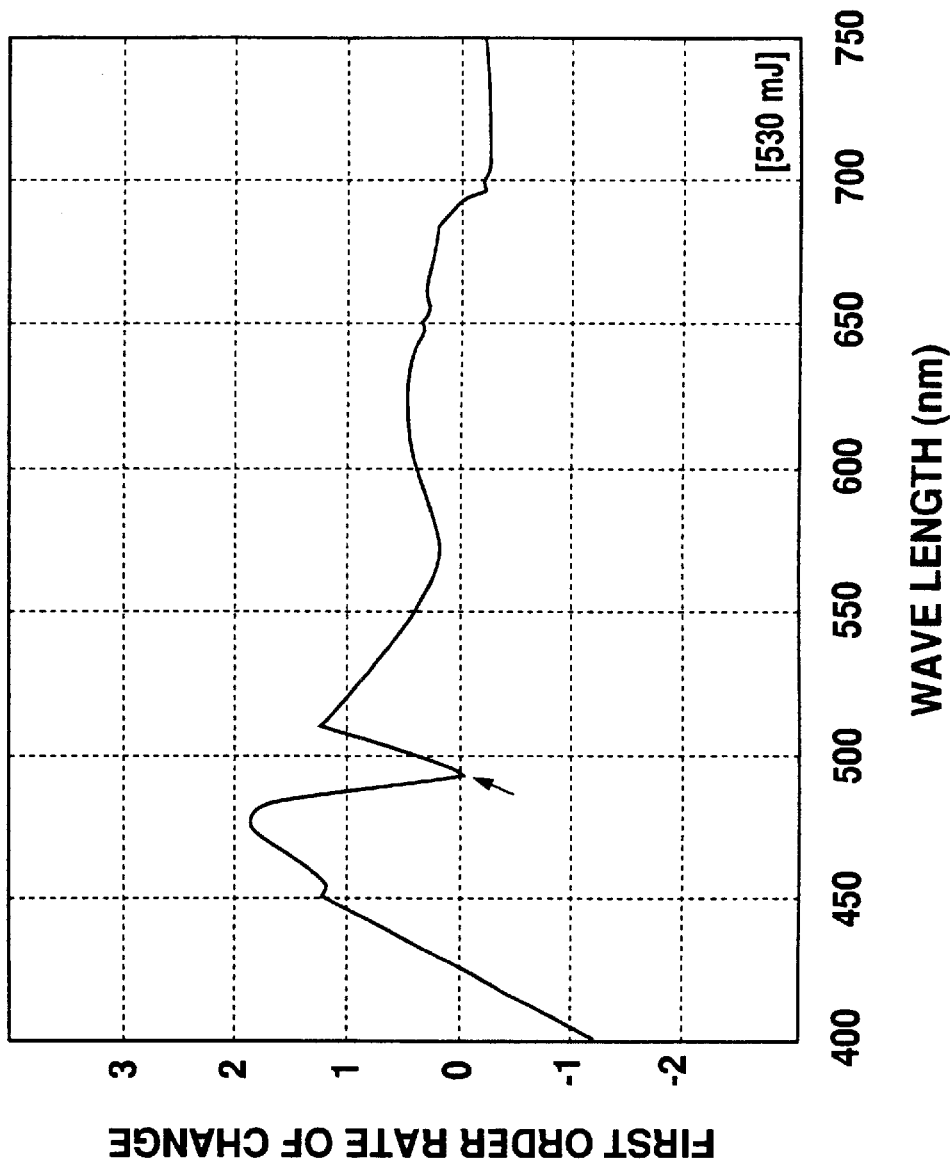
FIG. 7 is a graph showing a relationship between a first order rate of change in reflectance of FIG. 3 and a wave length.
Figure 8:
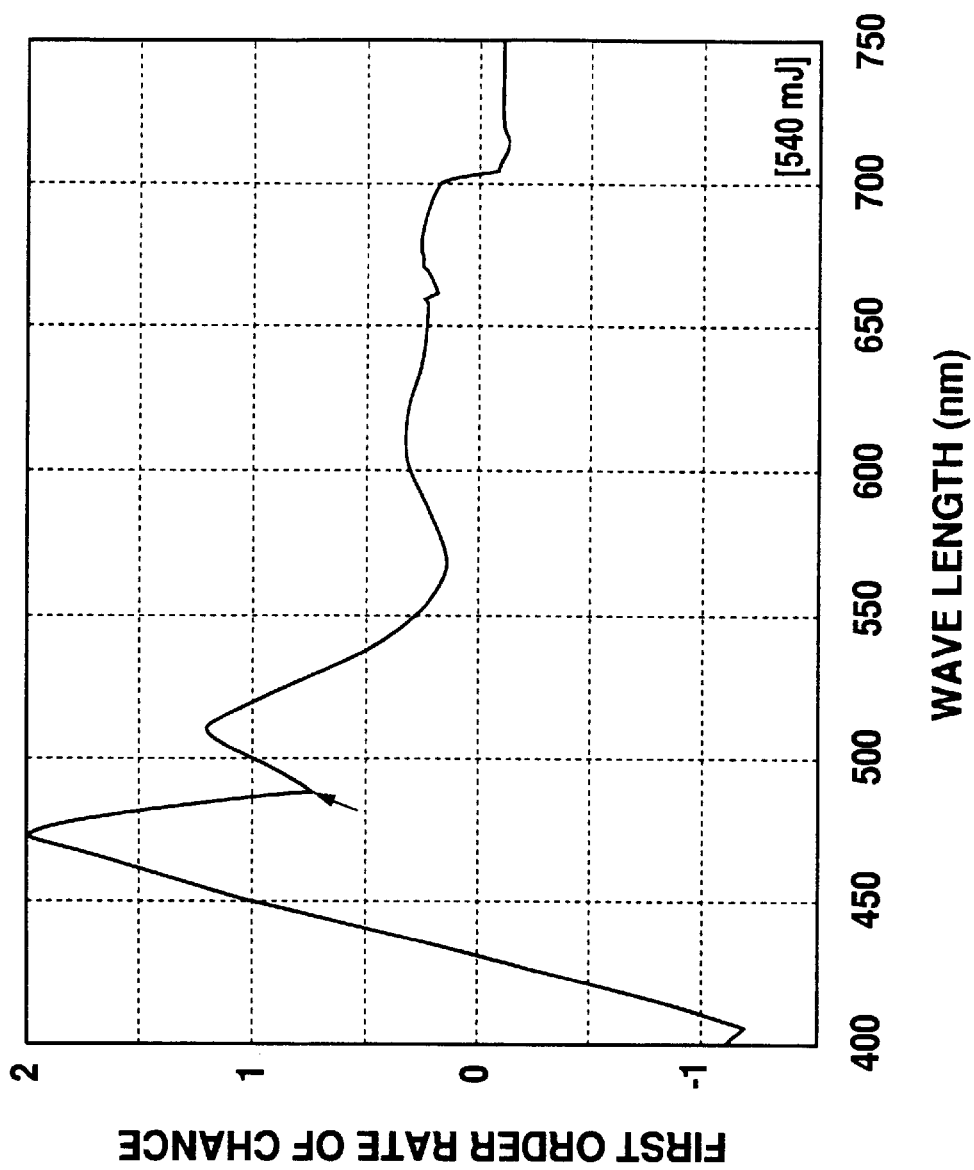
FIG. 8 is a graph showing a relationship between a first order rate of change in reflectance of FIG. 4 and a wave length.
Figure 9:
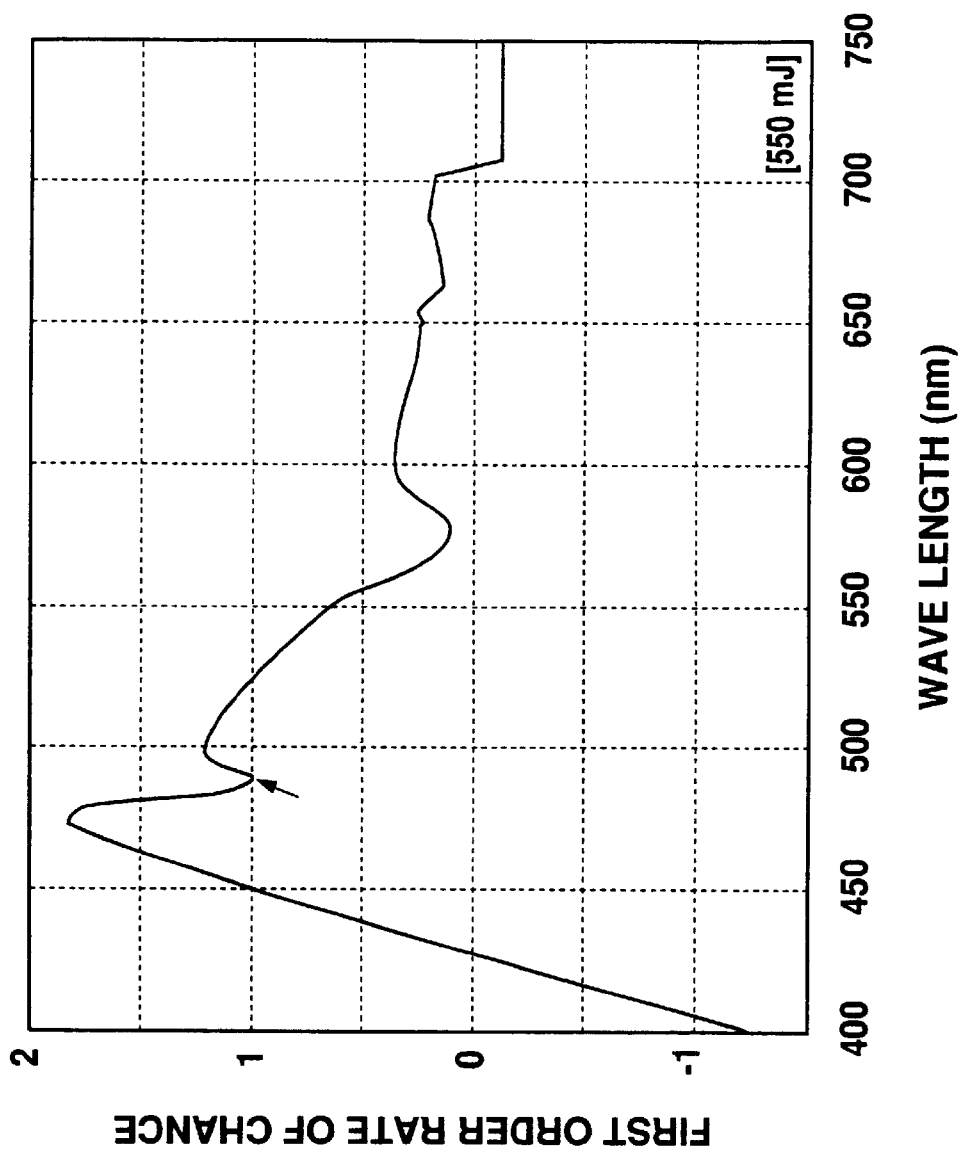
FIG. 9 is a graph showing a relationship between a first order rate of change in reflectance of FIG. 5 and a wave length.
Figure 10:
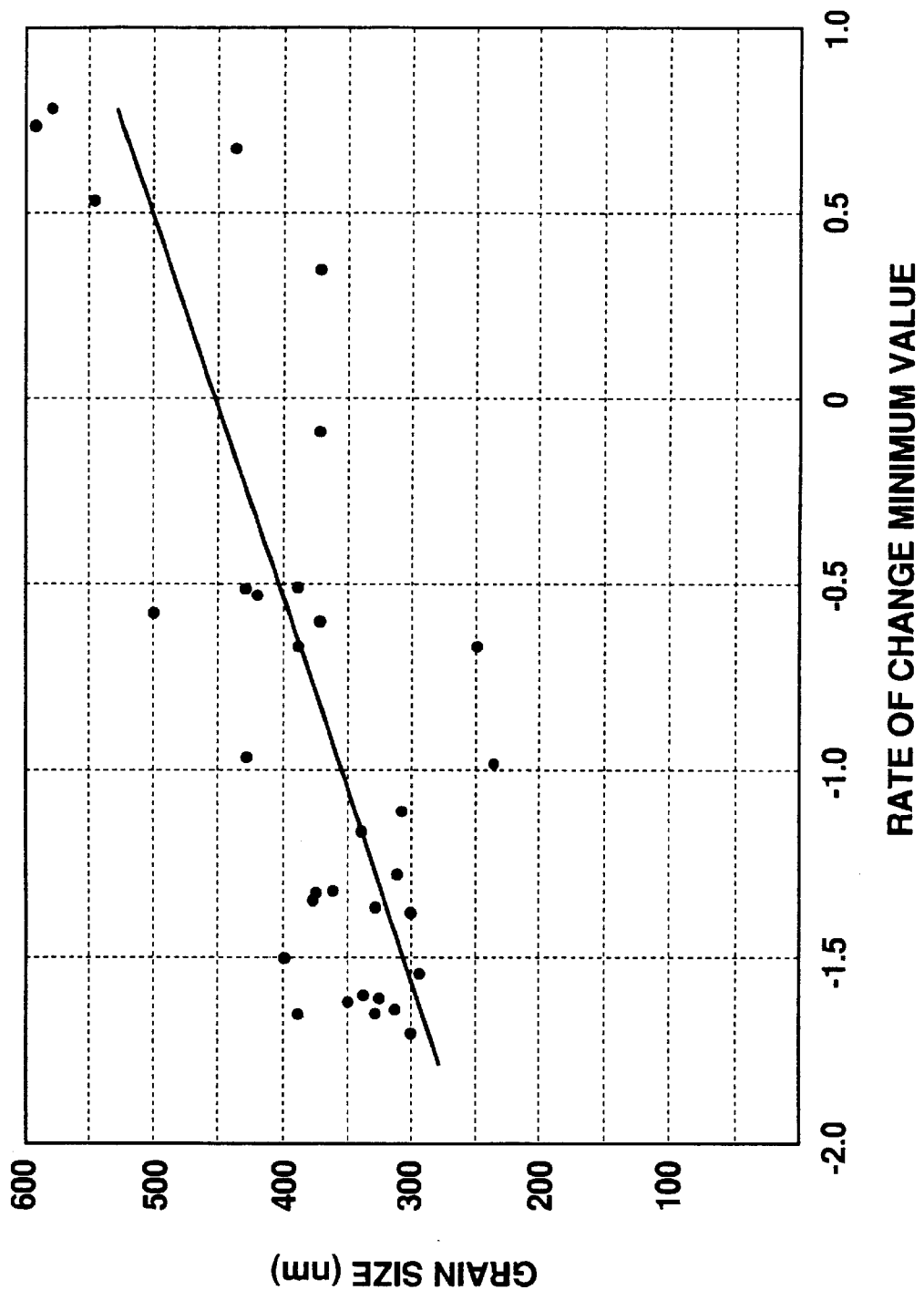
FIG. 10 is a graph showing a relationship between the minimum value of the rate of change and the grain size of the p-si film.

FIG. 10 is a graph showing a relationship between the optical value obtained and grain sizes measured with Secco etching or the like in a number of p-Si films. The grain sizes are plotted in dots. The solid line represents a trend in the dots distribution. The greater the optical value is, i.e. the more the downward slopes in FIGS. 2 to 5 are loosed, the greater the grain size is. The grain size is changed linearly to the optical value under the condition. The grain size can thus be deduced by calculating the rate of change in the reflectance and the optical value.

The mechanism of the characteristic slope in the relationship between the reflectance or its rate of change and the unique wave length is not apparent. It is, however, assumed that dominance of reflection and irregular reflection is inverted depending on a crystal order and the inversion of the dominance appears especially at the above-mentioned wave length. The crystal grain size can be determined by measuring the optical value in a back calculation.

Figure 11:
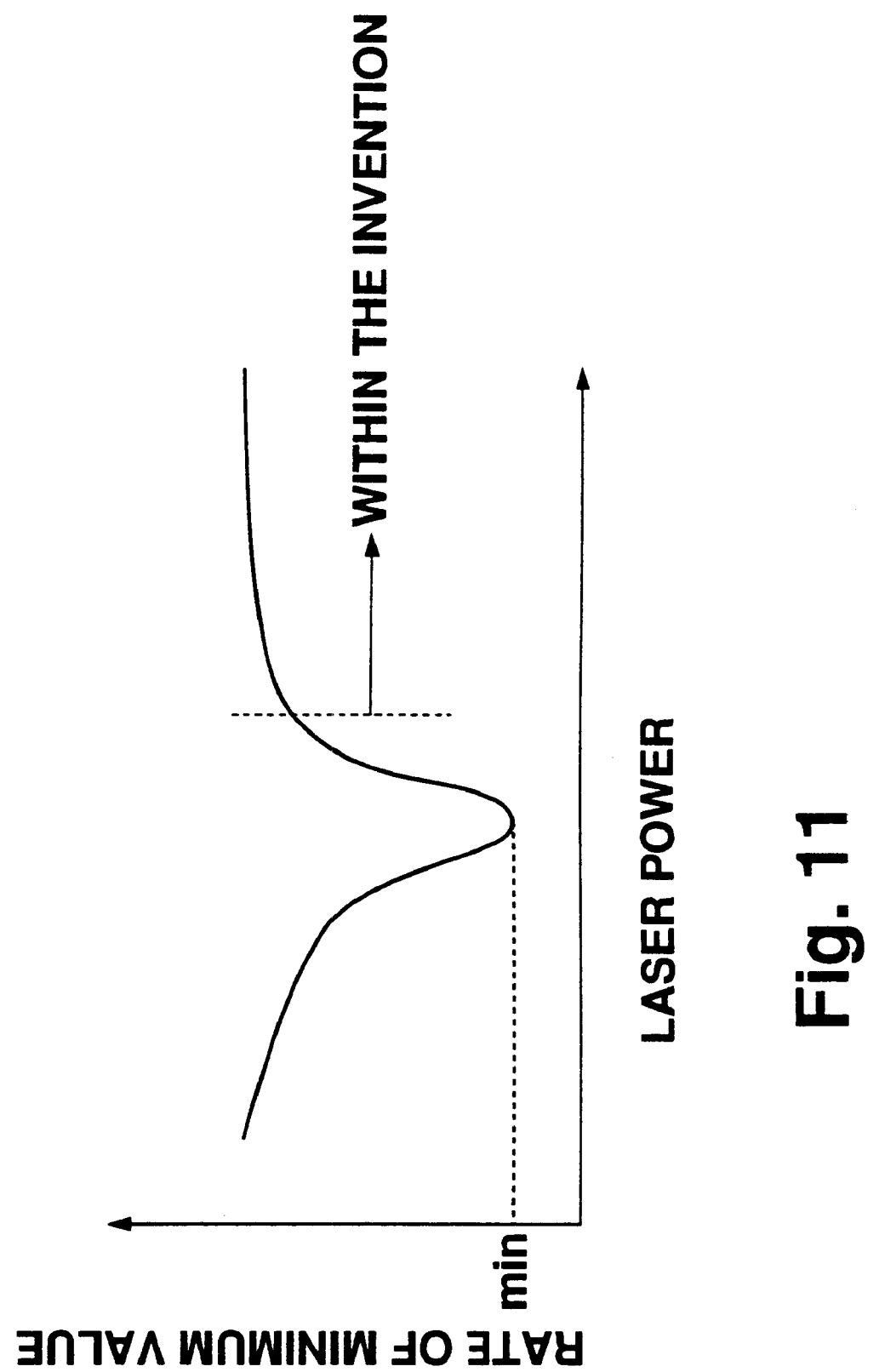
FIG. 11 is a graph showing a relationship between a laser energy and the minimum value of the rate of change in the reflectance.

According to the present invention, it is further empirically found that the relationship between the optical value and the laser energy (grain size) is represented by a curve shown in FIG. 11. In FIG. 11, the optical value is at minimum in a certain energy range, and increases at both ends of the curve symmetrically. The irradiated energy density through which the minimum optical value is obtained is approximately 300 mJ/cm$^2$ to 350 mJ/cm$^2$, which is determined by experiments. The laser energy density of the ELA should be finely adjusted to approximately 400 mJ/cm$^2$ to 500 mJ/cm$^2$. Consequently, the relationship between the optical value and the laser power (grain size) is represented by a nearly linear line in the present invention, as shown in FIG. 10.

Figure 12:
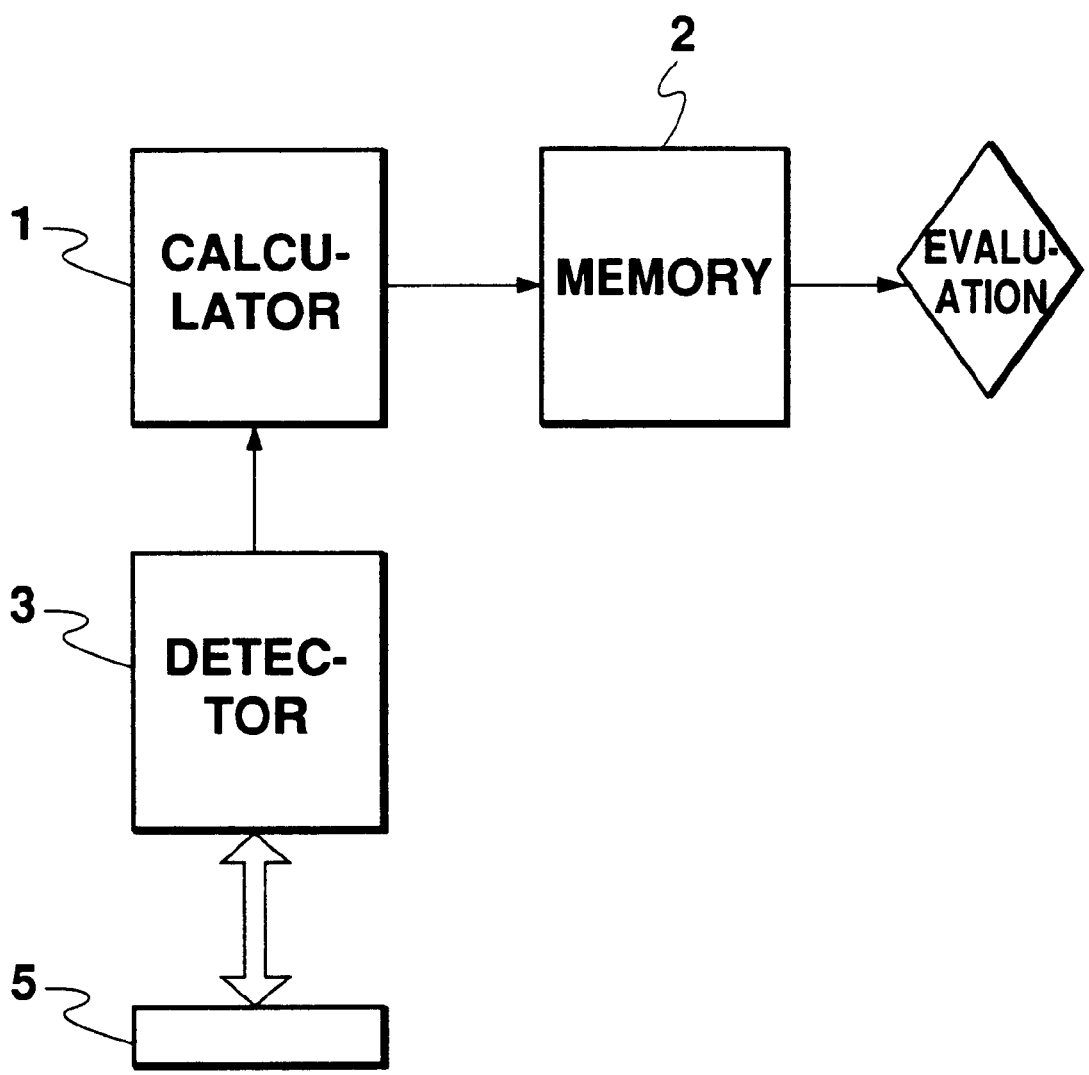
FIG. 12 is a block diagram showing an evaluator of a semiconductor film in one embodiment according to the present invention.

FIG. 12 is a block diagram showing an evaluator of one embodiment according to the present invention. Numeral 1 represents a calculator, numeral 2 represents a memory, numeral 3 represents a detector and numeral 5 represents a substrate formed of a semiconductor film to be evaluated. In the detector 3, a coaxial fiber is composed of a light emitting element such as a halogen lamp and of a light catching element.

On the substrate 5, p-Si film is formed by applying the ELA to crystallize a-Si formed on an insulating substrate. The detector 3 irradiates light to the substrate 5, detects reflected light therefrom and determines its spectral characteristics. The spectral characteristics information is sent to the calculator 1. The calculator 1 finds a wave length dependency of reflectance as shown in FIGS. 2 to 5, calculates first order rate of change of the reflectance shown in FIGS. 6 to 9, and finds the minimum value to determine an optical value. The optical value is sent to the memory 2. The optical value and the corresponding grain size shown in FIG. 10 are stored in the memory 2 in advance. The memory 2 is, for example, a nonvolatile memory storing the grain size in which information based on the optical value is an address of the grain size. The address is produced based on the optical value sent from the calculator 1, and the corresponding grain size is read out. The grain size thus read out is determined to be a grain size of the substrate 5. The grain size is measured on plural points of the substrate 5, whereby dispersion within the irradiated range of the ELA energy can be controlled. The information stored in the memory 2 can be matched with a long term condition change by rewriting the information stored in the memory 2 in accordance with properties of the ELA device and used hours of the device, by replacing the memory or the like.

According to the present invention, the p-Si film is evaluated by measurement of the light reflectance, i.e. by irradiating light and catching the light reflected. Accordingly, in-line monitoring can be realized. Immediately after forming the p-Si film, the grain size is measured according to the present invention to control the ELA.

Figure 13:
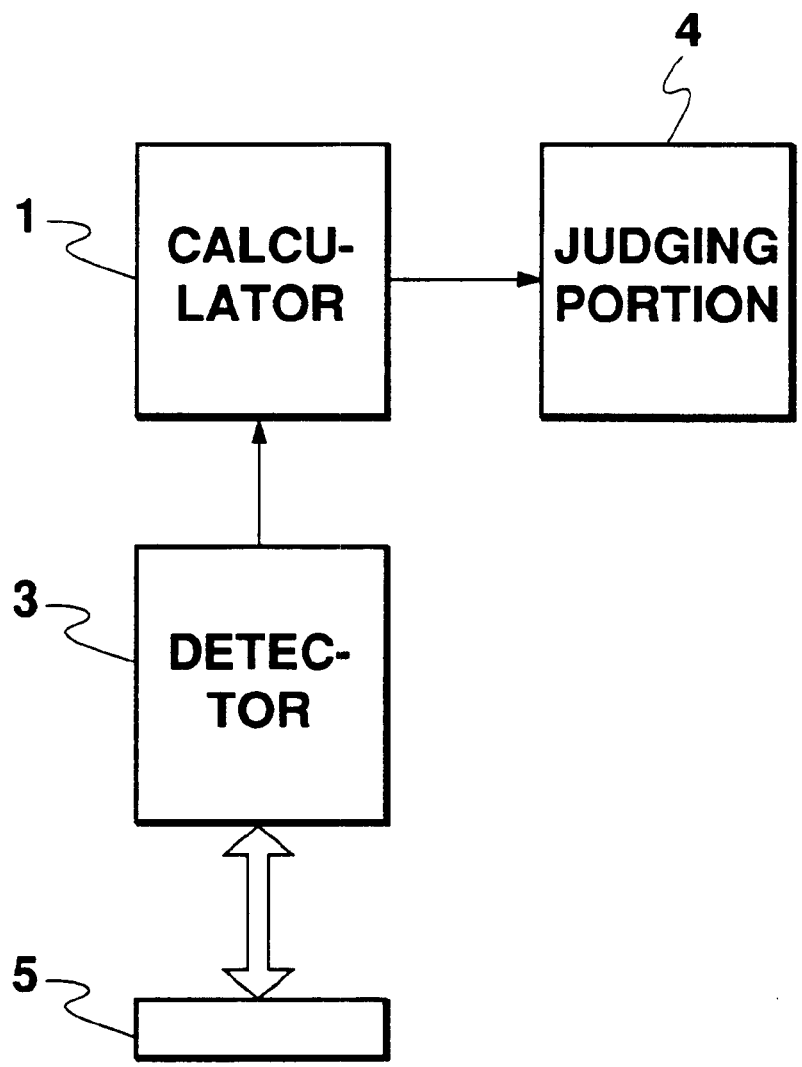
FIG. 13 is a block diagram showing an evaluator of a semiconductor film in one embodiment according to the present invention.

FIG. 13 is an evaluator introduced to the production process. Numerals 1, 3 and 5 represent a calculator, a detector and a substrate, receptively, similar to that shown in FIG. 12. Numeral 4 represents a judging portion. An upper limit and a lower limit of the optical value within an acceptable grain size of the p-Si are set in the judging portion 4. An optical value sent by the calculator 1 is compared with the upper and lower limits to examine whether or not the grain size in the substrate 5 is in the acceptable range, thereby judging whether or not the substrate 5 ( i.e. the p-Si film on the substrate ) is good. In the case of the substrate 5 being judged to be defective, the substrate 5 is prevented from moving to the next step.

In the evaluating step of the present invention after the ELA step, the grain size is measured immediately after the ELA. Due to the evaluating step of the present invention, in the case that the grain size does not satisfactorily grow because of a change in the irradiated laser energy due to any reason such as moisture, particle, contamination in an optical system or exhaustion, the following measure is taken: the substrate is immediately taken out of the production line and discarded, or is sent to the etching step of the p-Si film to remove the p-Si film and a new film is formed again. Moreover, the ELA step is combined with the evaluating step of the present invention, whereby the p-Si is evaluated while simultaneously irradiating a laser. A result of the evaluation is fed back to the ELA step. Therefore, the ELA can be carried by constantly adjusting the laser energy to an optimum level.

What is claimed is:

1. An apparatus for evaluating a semiconductor film on a substrate, comprising:

an irradiator for irradiating light to the semiconductor film to be evaluated;

a detector for detecting the light reflected on the semiconductor film to be evaluated;

a calculator for calculating an optical value of the semiconductor film to be evaluated based on data obtained through the detector;

a memory for holding optical values of a plurality of semiconductor films and crystal grain sizes of the plurality of the semiconductor films corresponding to the optical values; and an evaluator for selecting a crystal grain size corresponding to the optical value of the semiconductor film to be evaluated which is calculated by the calculator referring to the correspondence in memory and determining the selected crystal grain size as a crystal grain size of the semiconductor film to be evaluated, wherein the optical value is a minimum value of the rate of change of the reflectance of the light within the predetermined wave length area.

2. An apparatus for evaluating a semiconductor film on a substrate, comprising:

an irradiator for irradiating light to the semiconductor film to be evaluated;

a detector for detecting the light reflected on the semiconductor film to be evaluated;

a calculator for calculating an optical value of the semiconductor film to be evaluated based on data obtained through the detector;

a memory for holding optical values of a plurality of semiconductor films and crystal grain sizes of the plurality of the semiconductor films corresponding to the optical values; and an evaluator for selecting a crystal grain size corresponding to the optical value of the semiconductor film to be evaluated which is calculated by the calculator referring to the correspondence in memory and determining the selected crystal grain size as a crystal grain size of the semiconductor film to be evaluated, wherein the reflectance is reflectance of light normally incident on the semiconductor film, and the predetermined wave length area is approximately 500 nm, in which a relationship between the wave length and the reflectance or a first order rate of change of the reflectance is unique.

3. An apparatus for evaluating a semiconductor film on a substrate, comprising:

an irradiator for irradiating light to the semiconductor film to be evaluated;

a detector for detecting the light reflected on the semiconductor film to be evaluated;

a calculator for calculating an optical value of the semiconductor film to be evaluated based on data obtained through the detector, a memory for holding optical values of a plurality of semiconductor films and crystal grain sizes of the plurality of the semiconductor films corresponding to the optical values; and an evaluator for selecting a crystal grain size corresponding to the optical value of the semiconductor film to be evaluated which is calculated by the calculator referring to the correspondence in memory and determining the selected crystal grain size as a crystal grain size of the semiconductor film to be evaluated, wherein the reflectance is reflectance of light normally incident on the semiconductor film, and the optical value is a minimum value in a unique area of a curve of relationship between the wave length and first order rate of change of the reflectance, where the wave length is approximately 500 nm.

* * * * *